United States Patent
Lehr et al.

(10) Patent No.: US 7,491,555 B2
(45) Date of Patent: Feb. 17, 2009

(54) METHOD AND SEMICONDUCTOR STRUCTURE FOR MONITORING THE FABRICATION OF INTERCONNECT STRUCTURES AND CONTACTS IN A SEMICONDUCTOR DEVICE

(75) Inventors: Matthias Lehr, Dresden (DE); Kai Frohberg, Niederau (DE); Holger Schuehrer, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 218 days.

(21) Appl. No.: 11/419,782

(22) Filed: May 23, 2006

(65) Prior Publication Data

US 2007/0048883 A1 Mar. 1, 2007

(30) Foreign Application Priority Data

Aug. 31, 2005 (DE) .................... 10 2005 041 283

(51) Int. Cl.
*H01L 21/66* (2006.01)
(52) U.S. Cl. .......................................... 438/14; 438/18

(58) Field of Classification Search ................ 438/14, 438/17, 18, 625, 628; 700/121
See application file for complete search history.

(56) References Cited

U.S. PATENT DOCUMENTS

| | | | |
|---|---|---|---|
| 5,900,645 A | 5/1999 | Yamada | 257/48 |
| 5,981,302 A * | 11/1999 | Alswede et al. | 438/15 |
| 6,777,676 B1 * | 8/2004 | Wang et al. | 250/310 |
| 2003/0167632 A1 * | 9/2003 | Thomas et al. | 29/841 |
| 2005/0017361 A1 * | 1/2005 | Lin et al. | 257/756 |
| 2005/0070085 A1 * | 3/2005 | Huang et al. | 438/614 |
| 2006/0246718 A1 * | 11/2006 | Frohberg et al. | 438/638 |

FOREIGN PATENT DOCUMENTS

WO    WO 03/067653 A2    8/2003

* cited by examiner

*Primary Examiner*—Savitri Mulpuri
(74) *Attorney, Agent, or Firm*—Williams, Morgan & Amerson, P.C.

(57) ABSTRACT

By measuring an electric characteristic of a test pad that is connected to a plurality of test vias formed in accordance with a specified process flow for forming contacts and vias of a semiconductor device, one or more process specific parameters may quantitatively be estimated. Thus, a fast and precise measurement method for contacts and vias is provided in a non-destructive manner.

19 Claims, 5 Drawing Sheets

METHOD AND SEMICONDUCTOR STRUCTURE FOR MONITORING THE FABRICATION OF INTERCONNECT STRUCTURES AND CONTACTS IN A SEMICONDUCTOR DEVICE

BACKGROUND OF THE INVENTION

1. Field of the Invention

The present invention generally relates to the fabrication of integrated circuits, and, more particularly, to the formation of inter-level conductive connections and a corresponding monitoring of this process in semiconductor devices comprising one or more metallization layers.

2. Description of the Related Art

In an integrated circuit, a large number of circuit elements, such as transistors, capacitors and the like, are formed in or on an appropriate substrate, usually in a substantially planar configuration. Due to the large number of circuit elements and the required complex layout of many modern integrated circuits, generally the electrical connection of the individual circuit elements may not be established within the same level on which the circuit elements are manufactured, but such electrical connections may be established in one or more additional "wiring" layers, also referred to as metallization layers. These metallization layers generally include metal lines, providing the inner-level electrical connection, and also include a plurality of inter-level connections, also referred to as vias, wherein the metal lines and vias may also be commonly referred to as interconnections. In this specification, unless otherwise specified, a contact connecting to a circuit element or a portion thereof, for example a gate electrode or a drain or source region of a transistor, may also be considered as an inter-level connection.

Due to the continuous shrinkage of the feature sizes of circuit elements in modern integrated circuits, the number of circuit elements for a given chip area, that is, the packing density, also increases. The increased packing density usually requires an even greater increase in the number of electrical interconnections to provide the desired circuit functionality. Therefore, the number of stacked metallization layers may increase as the number of circuit elements per chip area becomes larger. The fabrication of a plurality of metallization layers involves extremely challenging issues to be solved. For example, mechanical, thermal and electrical reliability issues of up to twelve stacked metallization layers that are required for sophisticated aluminum-based microprocessors must be addressed. Semiconductor manufacturers are increasingly replacing the well-known metallization metal aluminum with a metal that allows higher current densities and hence allows reducing the dimensions of the interconnections. For example, copper and alloys thereof are metals generally considered to be a viable candidate for replacing aluminum due to their superior characteristics in view of higher resistance against electromigration and significantly lower electrical resistivity when compared with aluminum.

In spite of these advantages, copper also exhibits a number of disadvantages regarding the processing and handling of copper in a semiconductor facility. For instance, copper may not be efficiently applied onto a substrate in larger amounts by well-established deposition methods, such as chemical vapor deposition (CVD), and copper also may not be effectively patterned by the usually employed anisotropic etch procedures. In manufacturing metallization layers including copper, the so-called damascene technique is therefore preferably used wherein a dielectric layer is first blanket deposited and then patterned to define trenches and vias, which are subsequently filled with copper or copper alloys. A further major drawback of copper is its tendency to readily diffuse in silicon dioxide and other low-k dielectrics.

It is therefore necessary to employ a so-called barrier material in combination with a copper-based metallization to substantially reduce diffusion of copper into the surrounding dielectric material, as copper may readily migrate to sensitive semiconductor areas, thereby significantly changing the characteristics thereof. The barrier material provided between the copper and the dielectric material should, however, in addition to the required barrier characteristics, exhibit good adhesion to the dielectric material as well as to the copper and copper alloys and should also have as low an electrical resistance as possible so as to not unduly compromise the electrical properties of the interconnection as typically the barrier material's electric resistance is significantly greater than the electric resistance of copper and many of the copper alloys. In typical copper-based applications, tantalum and tantalum nitride, alone or in combination, as well as titanium and titanium nitride, alone or in combination, may successfully be employed as barrier layers. However, any other barrier layer schemes may be used as long as the required electrical, diffusion hindering and adhesion characteristics are obtained.

Irrespective of the material used for the barrier layer, with steadily decreasing features sizes, process engineers are increasingly confronted with the challenging task to form respective openings in the dielectric layer and deposit an extremely thin barrier layer within these openings, having significantly high aspect ratios of approximately 5 or more for a trench width or a via diameter of about 0.2 μm and even less. The thickness of the barrier layer has to be chosen as thin as possible to not unduly consume "precious" space of the interconnection that should be filled with the more conductive copper, yet reliably suppressing or preventing the diffusion of the copper into the neighboring dielectric. On the other hand, the etch process for forming the via openings is very critical as, on the one side, the opening has to reliably "land" on, i.e., connect to, the underlying metal or semiconductor region, if a contact opening is considered, while, on the other side, the "consumption" of metal is to be maintained at a low level, when etching into the metal or conductive region, since even after re-filling the via or contact opening, the barrier material may increase the overall resistivity of the underlying metal. Moreover, the deposition of the barrier material within high aspect ratio vias requires improved techniques for physical vapor deposition (PVD) processes or any other processes that are used in depositing conductive materials on a substrate, since usually an enhanced directionality of the barrier atoms and molecules to be deposited is necessary to direct the barrier atoms and molecules to the bottom of the vias and in particular to lower sidewall portions of the vias in order to reliably provide a diffusion barrier for metals such as copper and copper-based materials. On the other hand, the thickness of the barrier layer may be kept at a low level so as to not unduly increase the contact resistance between the metal region or conductive region to the via.

In particular for highly scaled semiconductor devices, a high degree of uniformity of corresponding interconnect structure and contact vias is important, since any variation in resistance and thus current density may lead to fluctuations during operation of the device and may even result in a premature failure of the device.

Figure 1:
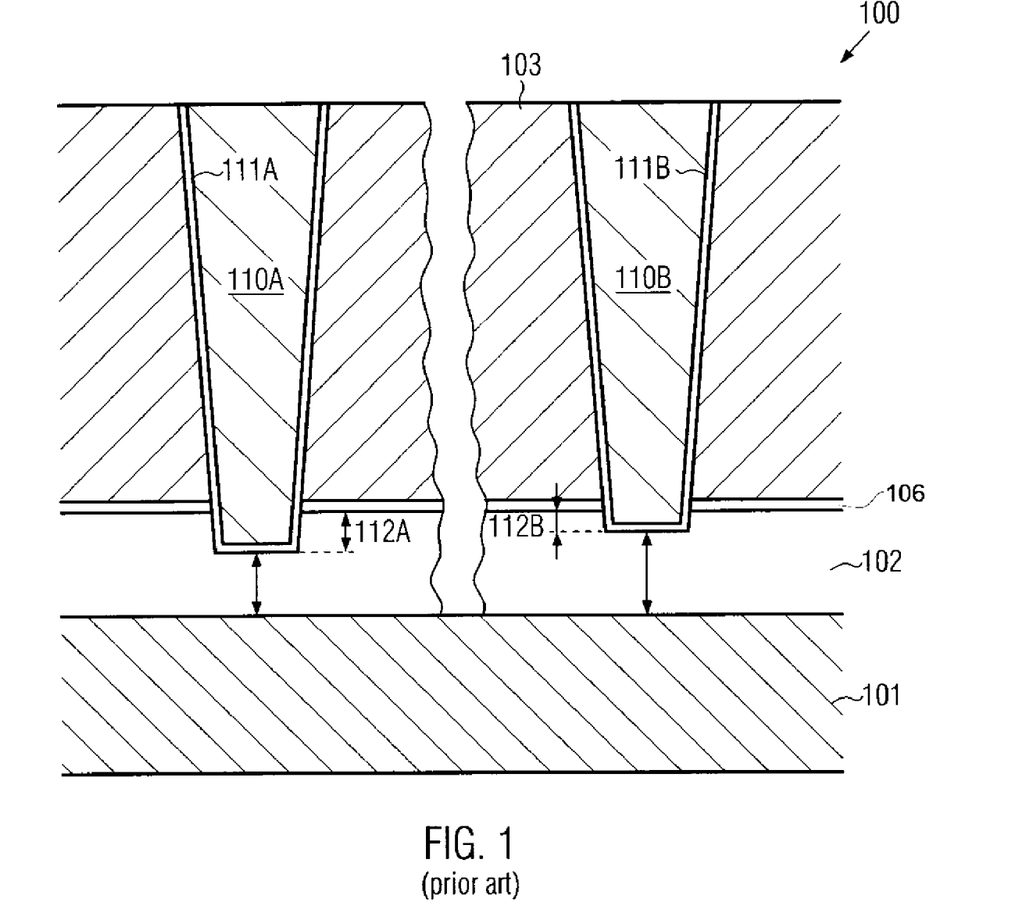
FIG. 1 schematically shows a cross-sectional view of a semiconductor device having formed therein conductive vias, the characteristics of which are conventionally monitored by electron microscopy techniques.

With reference to FIG. 1, the problems involved in forming vias to underlying metal regions and other conductive regions may be described in more detail. In FIG. 1, a semi-conductor structure 100 comprises a substrate 101, which is to represent any appropriate substrate for the formation of microstructures including conductive and insulating areas, wherein at least some of the conductive areas are used for flowing a current through the semiconductor structure 100. For example, the substrate 101 may comprise a plurality of circuit elements of an integrated circuit, the electrical connection of which may require the formation of one or more "wiring" layers for providing the specified functionality of the integrated circuit. For convenience, any such circuit elements, such as transistors, capacitors and the like, are not shown. Formed above the substrate 101 is a conductive region 102, such as a contact region of a transistor, a capacitor and the like, so that the conductive region 102 may represent a highly doped semiconductor region, a semiconductor region including a metal silicide and the like. In other cases, the conductive region 102 may represent a metal line or any other metal region according to specific design criteria. For example, as previously pointed out, in highly scaled integrated circuits, frequently, copper or copper-based metals are used for forming highly conductive metal regions.

A dielectric layer 103 comprised of any appropriate material or material composition, such as silicon dioxide, silicon nitride, low-k dielectric materials and the like, is formed above the metal region 102, wherein an etch stop layer 106 is typically provided between the metal region 102 and the dielectric layer 103. The etch stop layer 106 may be comprised of any appropriate material that exhibits a high etch selectivity with respect to the material of the dielectric layer 103 to allow an efficient control of an etch process through the dielectric layer 103. For example, silicon nitride, silicon carbide, nitrogen-enriched silicon carbide, silicon dioxide and the like may be appropriate materials for the etch stop layer 106. More-over, a first via 110a is formed on the left hand side of the semiconductor structure 100, wherein the via 110a may be filled with a highly conductive material, such as metal and metal compounds and the like. Typically, a conductive barrier layer 111a may be formed on sidewalls and typically at the bottom of the via 110a to provide an efficient diffusion barrier and also to enhance the mechanical integrity of the via 110a. The via 110a may be formed in accordance with a specific manufacturing sequence, thereby forming the via 110a so that it extends with a certain distance 112a into the conductive region 102. On the right hand side of the semiconductor structure 100 is shown a second via 110b, which may substantially have the same characteristics as the via 110a, which may however represent a via formed in a very different device region or may represent a via formed on a different substrate according to substantially the same manufacturing sequence, wherein, however, slight variations such as process tool drift and the like may result in a slightly different configuration of the via 110b. For example, the barrier layer 111b may exhibit a different thickness and/or the via 110b may extend into the conductive region 102 with a different distance 112b, thereby significantly affecting the overall performance of the semiconductor device 100, since the overall electrical behavior of the conductive region 102 as well as of the vias 110a, 110b may depend on the finally obtained configuration. For example, as previously explained, if a highly conductive material, such as copper or a copper alloy, may be used in the vias 110a, 110b and the conductive region 102, while a significantly less conductive material is used for the barrier layers 111a, 111b, the resulting electrical resistance of the conductive region 102 and also the performance of the vias 110a, 110b may vary according to the magnitude of the distances 112b, 112a. Thus, particularly in highly scaled semiconductor devices, it is important to precisely monitor and control the manufacturing process for the vias 110a, 110b.

During the formation of the vias 110a, 110b, an anisotropic etch process is performed on the basis of a specified etch recipe, which depends on the material composition of the dielectric layer 103 and other device and process requirements. On the basis of a previously formed resist mask or hard mask, the anisotropic etch process is performed wherein, depending on the manufacturing sequence, vias of different depth or substantially the same depth, as is for instance shown in FIG. 1, have to be formed. Hereby, the anisotropic etch front has to be reliably stopped in and on the etch stop layer 106 to compensate for any across-substrate variations, for different intended etch depths or for substrate-to-substrate variations. In a subsequent etch process, the etch stop layer 106 may be opened, wherein a reliable connection from the via opening into the conductive region 102 is required. Depending on the uniformity of the previous etch process, the etch selectivity of the layer 106, the uniformity of the subsequent etch process for opening the layer 106, and other process non-uniformities, the amount of etching into the conductive region 102 and thus the finally obtained distance 112a, 112b may vary, thereby contributing to the above-explained non-uniformities of the electrical performance of the device 100. After the formation of the via openings within the dielectric layer 103, the etch stop layer 106 and the conductive region 102, the conductive barrier layer 111a, 111b, which may be comprised of one or more materials, may be formed by sputter deposition, chemical vapor deposition (CVD) and the like, wherein typically great efforts are made for forming a very thin layer which, however, reliably covers at least the sidewalls of the via openings down to the bottom, which itself may not necessarily be covered by the respective barrier layer. Thus, in combination with a varying distance 112a, 112b, a variation of the formation process for the barrier layer 111a, 111b may also significantly affect the finally achieved performance of the device 100.

Thus, in conventional monitoring processes, especially the distance 112a, 112b is determined by using SEM (scanning electron microscopy) and/or TEM (transmission electron microscopy) images of cross-sections which, however, requires a great deal of effort in preparing appropriate samples. Moreover, it is a destructive measuring technique and thus provides only low statistics, which may therefore reduce the reliability of the measurement result. Moreover, the entire measurement procedure including the preparation of samples is very slow and thus may limit the ability to provide an efficient process control.

In view of the situation described above, there exists a need for an enhanced monitoring technique which avoids or at least reduces the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the monitoring and, in illustrative embodiments, the control of a process flow for forming vias or contacts in a semiconductor device in a highly efficient and non-destructive manner, wherein electric measurement data are obtained which may then be evaluated to allow a quantitative assessment of one or more process parameters involved.

According to one illustrative embodiment of the present invention, a method comprises forming one or more test openings according to a specified process flow within a dielectric layer to provide a connection to a test pad, wherein the specified process flow represents a process flow used to form a via in a dielectric layer in order to provide an electric connection to a conductive region formed in a semiconductor device. Moreover, electric test data are then obtained from the test pad and at least one characteristic of the specified process flow is estimated on the basis of the electric test data.

According to another illustrative embodiment of the present invention, a method comprises forming a first metallization layer of a semiconductor device according to a first specified process flow, wherein the first metallization layer comprises one or more first test openings extending at least through a portion of the first metallization layer so as to connect to a first conductive test pad, which is located, together with a first conductive reference pad, below the first metallization layer. Moreover, the method comprises determining at least one first electric property of the first test pad in relation to the first conductive reference pad. Finally, at least one first characteristic of the first specified process flow is estimated on the basis of the at least one first electric property.

According to yet another illustrative embodiment of the present invention, a semiconductor structure comprises a first metallization layer located above a substrate and formed according to a first specified process flow used for fabricating semiconductor devices having specified design rules. The semiconductor structure further comprises a first conductive test pad formed between the substrate and the first metallization layer and further comprises one or more first test vias formed through at least a portion of the first metallization layer so as to provide electrical contact to the first conductive test pad.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention provides a technique that enables the assessment of one or more manufacturing processes during the formation of conductive vias connecting to an underlying conductive region, such as a metal region, a contact portion of a circuit element and the like. Contrary to conventional process monitoring techniques, the present invention contemplates the formation of specifically designed layer structures or appropriate openings formed in accordance with the specified process flow to be evaluated, wherein the influence of the one or more test openings or vias on the electrical characteristics of an appropriately designed lower lying test pad formed of a conductive material is determined. In this way, in some illustrative embodiments, an etch process for forming actual vias in a product device may be estimated on the basis of a variation of electrical characteristics of the test pad into which the test openings may be etched according to the specified process flow, thereby enabling quantitative estimation of the etch depth or recess within the test pad. Since corresponding electric measurement data may be obtained in a time efficient manner with high statistical significance, depending on the number of test structures provided in a test substrate or product substrate, one or more process parameters of the specified process flow may be monitored and, in some illustrative embodiments, may be controlled on the basis of the electrical test data. Depending on the test strategy, the electrical test data may be gathered in a highly "resolved" manner with respect to the involved manufacturing sequence, for instance, when corresponding semiconductor structures are provided on dedicated test substrates so as to allow the measurement of electrical characteristics of the respective test pads at any desired point of the manufacturing sequence, or when the structures are formed on product substrates and are designed so as to allow access to the test pads at intermediate stages of the manufacturing process flow. Thus, certain processes and process parameters may be monitored substantially individually, thereby providing a high degree of coverage and control of the respective process or process parameters. On the other hand, appropriately designed test structures may be integrated into product substrates, wherein, due to process requirements, access for external measurement devices may be practical only at certain points during the plurality of associated manufacturing processes wherein, however, a high degree of authenticity of the obtained electrical test data with respect to actual product devices is guaranteed. Moreover, in this case, a plurality of test structures may be provided on one or more product substrates, thereby also providing the potential to efficiently monitor and/or control the across-substrate uniformity of the manufacturing sequence for forming vias and contacts in semiconductor devices.

Figure 2A:
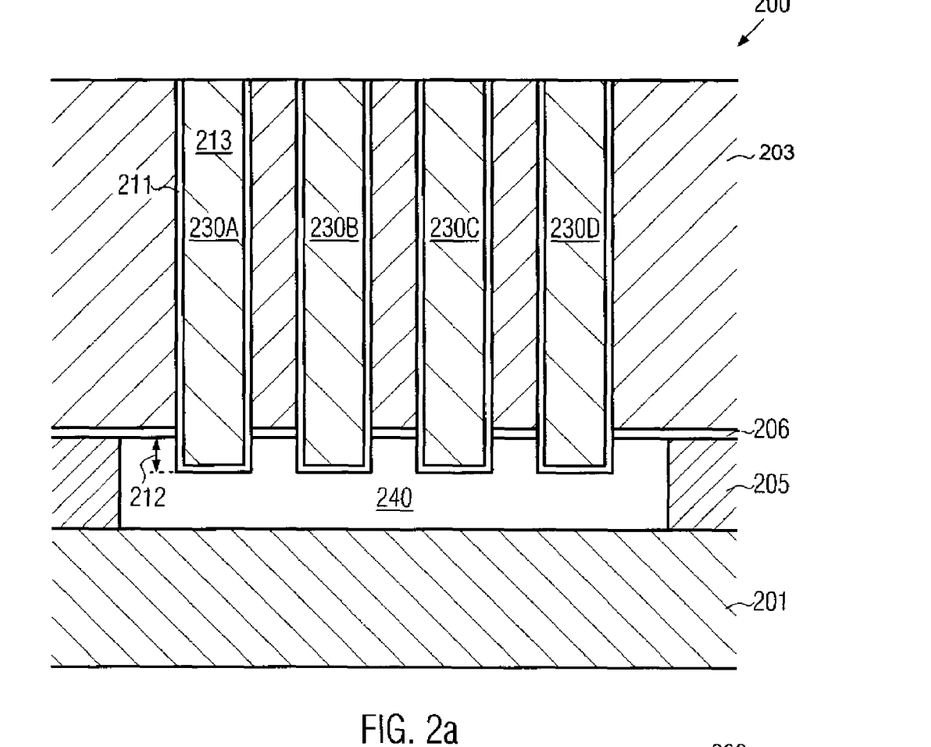
FIGS. 2a-2e schematically show cross-sectional views (FIGS. 2a and 2d) and top views (FIGS. 2b, 2c and 2e) of appropriately designed semiconductor structures including vias and openings that enable the monitoring and assessment of a via forming manufacturing sequence on the basis of electric measurements according to illustrative embodiments of the present invention.

With reference to FIGS. 2a-2g and 3, further illustrative embodiments of the present invention will now be described in more detail. FIG. 2a schematically shows a semiconductor structure 200 designed to obtain electrical test data regarding the manufacturing process of vias or contacts formed in a dielectric layer according to a specified process flow. In this respect, a process flow is to be considered as a sequence of manufacturing processes to form specific microstructures, such as integrated circuits, in accordance with predefined design rules, wherein the actual characteristics, dimensions and performance of the devices depend on the uniformity of the individual manufacturing processes. Typically, so-called process recipes are available for each of the specified manufacturing processes, which define the process parameters of the respective manufacturing process for obtaining a process output in accordance with predefined target values. However, due to predictable and non-predictable events and influences, the process output may vary even for substantially the same process recipe. Moreover, new process recipes may need to be established to account for changes in device design and the like so that it may be important to estimate the influence of one or more process parameters on the process output. As previously pointed out, one important process during the formation of vias and contacts is the etch process for forming a via opening through a dielectric layer, an etch stop layer and into an underlying conductive region, since the reliability of the vias and contacts as well as of the conductive region may significantly depend on the finally obtained etch depth. A further important manufacturing process may be the coverage of at least sidewalls of the respective via openings and contact openings by means of a barrier material, as is typically encountered in the formation of vias in copper-based metallization layers, wherein the reliable coverage and the thickness of the barrier layer significantly determines the overall performance of the corresponding vias. Since the barrier layer in copper-based vias typically exhibit a significantly reduced conductivity compared to copper or copper alloy, a varying barrier layer thickness especially in the lower portion of the via may be efficiently detected by electrical measurement, as will be explained later on.

The semiconductor structure 200 comprises a substrate 201 which may, in illustrative embodiments, represent a dedicated test substrate that is processed along with product substrates in accordance with a specified process flow. In other embodiments, the substrate 201 may represent a product substrate having formed thereon on specific device areas (not shown) microstructural features and circuit elements, such as transistors, capacitors and the like. In any case, the substrate 201 may represent any appropriate substrate for forming thereon and therein semiconductor devices in accordance with specified design rules, requiring the formation of vias and contacts.

The semiconductor structure 200 may further comprise a conductive test pad 240 formed above the substrate 201 on a dedicated substrate region. The test pad 240 may, in particular embodiments, be comprised of substantially the same material to which an electric connection by means of a via or contact is to be formed in actual functional semiconductor devices. For example, the test pad 240 may be provided in the form of a conductive metal region comprised of aluminum, copper, copper alloys and the like, as it may be encountered in corresponding semiconductor devices, such as metal lines in a metallization layer and the like. In other examples, the test pad 240 may represent a highly doped semiconductor region, possibly in combination with a metal-semiconductor compound formed therein, at least partially, as is typically encountered in silicon-based semiconductor devices, wherein the conductivity of highly doped silicon regions is frequently increased by forming a metal silicide at least in a portion of the corresponding semiconductor region. The test pad 240 may have design dimensions that are selected such that test openings in a desired number and shape may be etched into the test pad 240, wherein the total volume of the test pad 240 may significantly vary with the etch depth of the corresponding test opening etched into the test pad 240. Moreover, the test pad 240 may be designed such that a contact to a peripheral measurement device may be established, wherein such an electrical connection to peripheral devices may be provided by corresponding contact pads (not shown in FIG. 2a) which may not necessarily be provided in the same level as the test pad 240. Furthermore, the test pad 240, in illustrative embodiments, is not electrically connected to any other circuit elements that may be included in the substrate 201, as is previously explained. Thus, the test pad 240 may be bordered by a dielectric layer 205, which may be comprised of any appropriate dielectric material. For example, the test pad 240 in combination with the dielectric layer 205 may be comprised of the same materials as are used in actual product devices, such as the metallization layer of an integrated circuit and the like. For example, the dielectric layer 205 may be comprised of silicon dioxide, silicon nitride, silicon oxynitride, a low-k dielectric material, such as SiCOH, low-k dielectric polymer materials and the like.

Formed above the dielectric layer 205 and the test pad 240 is a second dielectric layer 203, which is comprised of materials corresponding to those materials used for the formation of actual semiconductor devices. That is, the dielectric layer 203 may represent an interlayer dielectric material used for insulating circuit elements, such as transistors, capacitors and the like, wherein the inter-level dielectric material is frequently provided in the form of silicon dioxide formed in accordance with a specified deposition recipe. In other cases, the dielectric layer 203 may represent the dielectric material of a metallization layer of a specific semiconductor device design. Thus, in highly sophisticated integrated circuits, the dielectric layer 203 may represent the dielectric material used in a copper-based metallization layer and may thus comprise a high amount of dielectric material having a low permittivity. It should be appreciated that, in some illustrative embodiments, the dielectric layer 203 may have any appropriate material composition, thickness and other characteristics as long as the layer 203 corresponds to, in some embodiments, a dielectric layer as used in actual product devices. In other illustrative embodiments, the layer 203 may represent a metallization layer for actual semiconductor devices formed in other substrate areas of the substrate 201 requiring the formation of vias through the layer 203. The dielectric layer 203 may typically be separated from the layer 205 and the test pad 240 by an etch stop layer 206, which may be comprised of silicon nitride, silicon oxynitride, silicon carbide, nitrogen-enriched silicon carbide, or any other appropriate dielectric material that exhibits a high etch selectivity with respect to the material of the layer 203. Similarly, as is explained for the dielectric layer 203, the etch stop layer 206 may have the same characteristics as a corresponding etch stop layer formed in actual semiconductor devices, when the substrate 201 represents a dedicated test substrate, which may not necessarily have formed thereon any circuit elements.

At least one test opening is formed within the layer 203, 206 and partially in the conductive test pad 240, wherein, in some illustrative embodiments, at least the plurality of test openings or test vias 230a, 230b, 230c, 230d is provided, wherein, in some embodiments, the vias 230a, 230b, 230c, 230d substantially comprise the same design dimensions as corresponding vias or contacts to be formed in actual semiconductor devices. In other embodiments, the dimension of the at least one test via 230a, 230b, 230c, 230d may differ from the corresponding design dimensions of actual device vias and openings, wherein an appropriate correspondence may be established between the one or more test vias 230a, 230b, 230c, 230d and the actual vias and openings. The one or more test vias 230a, 230b, 230c, 230d may be comprised, in this manufacturing stage, of a conductive barrier layer 211 and a conductive material 213, wherein, in embodiments in which product devices are also commonly manufactured in and on the substrate 201, the material composition and the processes for forming the product devices in view of the barrier layer 211 and the fill material 213 are substantially identical, except for possible across-substrate non-uniformities. For example, for a copper-based metallization layer, the barrier layer 211 may be comprised of tantalum, tantalum nitride, titanium, titanium nitride, any combinations thereof, or any other appropriate conductive barrier materials providing the required diffusion blocking and mechanical characteristics. Similarly, the conductive material 213 may be comprised of copper or copper alloy. In other cases, the conductive material 213 may represent a contact material, such as tungsten, tungsten silicide, tungsten nitride and the like, as is typically used for forming contacts to circuit elements, such as transistors, capacitors and the like.

The semiconductor structure 200 as shown in FIG. 2a may be formed in accordance with a specified process flow, wherein, prior to the specified process flow, if required, any circuit elements may be formed in and on the substrate 201. Thereafter, the test pad 240 and the dielectric layer 205 may be formed in accordance with the specified process flow, wherein, depending on whether the substrate 201 is a dedicated test substrate or also includes product devices, the manufacturing sequence for the dielectric layer 205 and the test pad 240 may be specifically designed or may represent the manufacturing sequence for the corresponding product devices. For example, if product devices are simultaneously formed above specified substrate areas of the substrate 201, the test pad 240 may represent a highly doped semiconductor region, possibly including a metal silicide, and the dielectric layer 205 may represent a first interlayer dielectric material used for embedding circuit elements in other substrate areas. Corresponding processes for forming doped semiconductor regions, such as doped polysilicon lines and regions, and the subsequent formation of a dielectric material are well established and will not be described. In other cases, the dielectric layer 205 and the test pad 240 may be formed as part of a metallization layer, such as a copper-based metallization layer, on the basis of well-established process recipes. Thereafter, the etch stop layer 206 may be formed on the basis of well-established plasma enhanced chemical vapor deposition (PECVD) techniques in accordance with the specified process flow, the characteristics of which are to be assessed by means of the semiconductor structure 200.

Next, the dielectric layer 203 may be formed in accordance with the specified process flow including, for instance, CVD techniques, spin-on techniques and the like. Subsequently, an appropriately designed resist mask (not shown) may be formed above the layer 203 in accordance with the specified process flow, wherein, as previously explained, the dimensions of the one or more test vias 230a, 230b, 230c, 230d may be selected so as to substantially correspond to actual semiconductor devices or may differ therefrom, depending on process requirements. Moreover, the arrangement of the one or more test vias 230a, 230b, 230c, 230d may be selected so as to allow an efficient assessment of at least one electrical characteristic of the test pad 240 in a subsequent measurement process. Some exemplary arrangements for the one or more vias 230a, 230b, 230c, 230d will be described with reference to FIGS. 2b-2e later on.

Next, based on the appropriately designed resist mask (not shown), an anisotropic etch process in accordance with the specified process flow is performed, which may stop in and on the etch stop layer 206. Thereafter, a further etch step may be performed so as to etch through the etch stop layer 206 and into the test pad 240 in accordance with the specified process flow, that is, the etch processes may be performed based on a predefined etch recipe, the effect of which with respect to at least a penetration depth 212 into the test pad 240 is to be estimated by the semiconductor structure 200.

In some embodiments, the specified process flow may be discontinued at this manufacturing stage and the semiconductor structure 200 may be subjected to an electrical measurement procedure to estimate at least one electrical characteristic of the test pad 240, such as the sheet resistance or any other appropriate electrical parameter that allows one to determine or to evaluate the overall conductivity of the test pad 240. In this manufacturing stage, the semiconductor structure 200 is extremely sensitive to the characteristics of the etch processes of the specified process flow, since the penetration depth 212 significantly affects the conductivity or sheet resistance of the test pad 240 due to the amount of conductive material that is removed by the preceding etch process. Consequently, by performing well-established measurement procedures for determining the sheet resistance or the conductivity of the test pad 240, a quantitative measure for the magnitude of the recess 212 may be obtained. For this purpose, the test pad 240 may be contacted, for instance by means of appropriate contact pads (not shown in FIG. 2a) which may be formed within the dielectric layer 205 and which may be contacted by means of respective openings in the layer 203 that may have been formed simultaneously with the one or more test vias 230a, 230b, 230c, 230d. For example, the magnitude of the voltage required for driving a predefined current through the test pad 240 or the current obtained by applying a specified voltage to the test pad 240 may be determined as a measure of the recess or penetration depth 212.

In other embodiments, the manufacturing process may not be discontinued for a measurement procedure at this stage and may be continued according to the specified process flow by forming the conductive barrier layer 211 and subsequently filling in the conductive material 213 according to the specified process flow. As previously explained, the formation of the barrier layer 211 may involve highly complex deposition processes, such as sputter deposition, CVD, electroless plating deposition, atomic layer deposition (ALD) and the like, wherein the finally obtained thickness and coverage of the layer 211, particularly in the lower portion of the vias 230a, 230b, 230c, 230d may also significantly affect the overall performance of the vias 230a, 230b, 230c, 230d. Since the barrier layer 211 typically exhibits a significantly higher resistance compared to many of the conductive materials used in conductive regions, such as metal lines of metallization layers in actual devices and thus in the test pad 240, a reduction of conductivity of the test pad 240 is created, even though the one or more test vias 230a, 230b, 230c, 230d are generally electrically conductive. Since the magnitude of influence on the overall conductivity of the test pad 240 may now also depend on the characteristics of the barrier layer 211, that is, on the layer thickness for a given material composition, the evaluation of electrical characteristics of the test pad 240 may also allow the evaluation of the combined specified process flow including the deposition process for the barrier layer 211. Consequently, similar test procedures may be performed as described above to obtain electrical test data, which may, for instance, represent the conductivity of the test pad 240. In some embodiments, during the formation of the one or more test vias 230a, 230b, 230c, 230d, corresponding contact portions (not shown in FIG. 2a) to the test pad 240 may be simultaneously formed, which may then be advantageously used for contacting the test pad 240 by means of external measurement probes.

In some embodiments, the measurement procedure described above, i.e., the measurements of at least one electric characteristic of the test pad 240 substantially without filling the one or more test vias 230a, 230b, 230c, 230d, may be performed first and subsequently the specified process flow for manufacturing the vias 230a, 230b, 230c, 230d may be resumed, and subsequently a similar test procedure may be performed to provide electrical test data, which substantially corresponds to the etch process and thus the recess 212, and electrical test data, which substantially corresponds to the characteristics of the barrier layer 211. Any differences of the electrical test data, which may stem from a different contact procedure for the first measurement without metal filled in the vias 230a, 230b, 230c, 230d and any corresponding openings for contacting the pad 240, and for the second measurement performed on the basis of metal filled vias and corresponding contact portions of the pad 240, may readily be identified and compensated for. One possibility in this respect may be to perform a third measurement after the deposition of the barrier layer 211 to identify the influence of the barrier layer 211 on the electrical test probes, wherein it may be assumed that the electrical resistance provided by the conductive fill material 213 may be negligible compared to the resistance of the barrier layer 211. For instance, it may be assumed that the vias 230a and 230d may be used as "contact" openings for electrically contacting the test pad 240 by means of appropriately designed measurement probes, wherein it may be assumed that the vias 230a and 230d may represent appropriately dimensioned openings for introducing a corresponding probe. After determining the conductivity of the test pad 240 after completion of the etch process, a further measurement may be performed after the deposition of the barrier layer 211, thereby identifying the difference created by the contact resistance of the respective probe to the test pad 240, since the overall conductivity of the pad 240 is substantially not affected by the barrier layer 211. Thereafter, the measurement may be performed after filling in the highly conductive material 213, which may not significantly affect the contact resistance of the probe, which may now directly contact the material 213 and the test pad 240, thereby allowing the assessment of the influence of the barrier layer 211 of the remaining test vias 230b, 230c on the overall conductivity of the pad 240. In this manner, electrical test data may be created that provides a quantitative estimation for individual processes or process parameters of the specified process flow for forming the one or more test vias 230a, 230b, 230c, 230d.

Figure 2B:
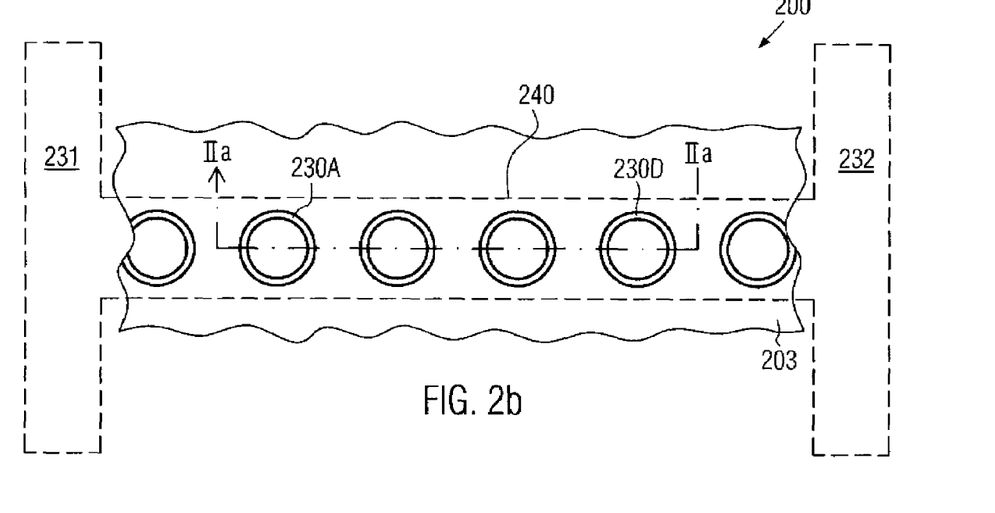

FIG. 2b schematically illustrates a top view of the semiconductor structure 200 for one exemplary embodiment of an appropriate arrangement of the plurality of test vias 230a, 230b, 230c, 230d. Here, a substantially linear configuration is shown, wherein the test pad 240, shown in dashed lines, has a size and thus volume such that the ratio between material removed by the etch process and the remaining material of the pad 240 may provide sufficient sensitivity for measuring, for instance, an electric characteristic representing the recess 212. Moreover, as indicated in dashed lines, respective contact pads 231 and 232 connected to the test pad 240 may be provided, which may be designed to allow access by means of an external measurement probe.

Figure 2C:
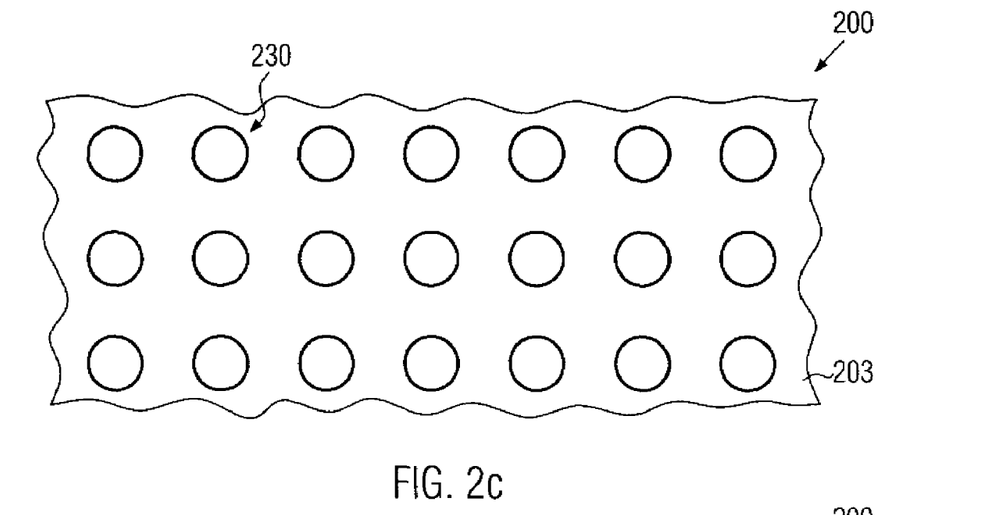

FIG. 2c schematically shows a top view of a plurality of test vias 230, which are arranged in a two-dimensional array, thereby also "consuming" a significant amount of the underlying test pad 240.

Figure 2D:
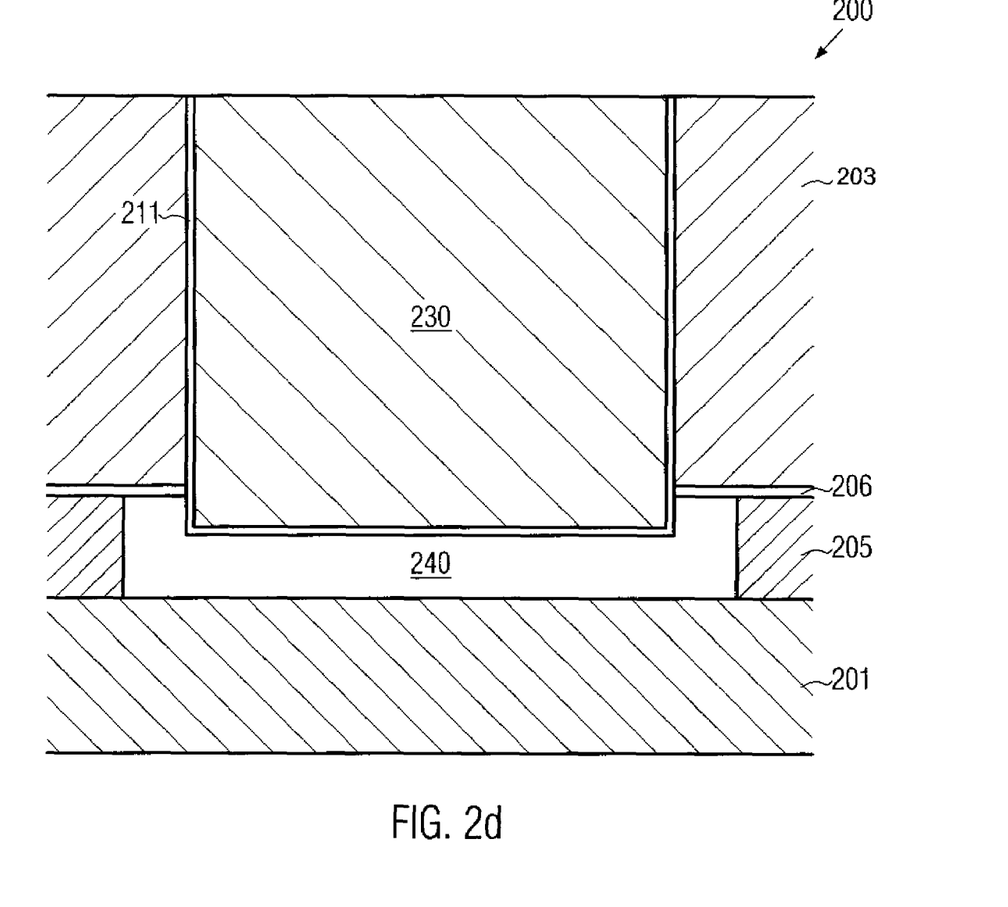

FIG. 2d schematically shows a further illustrative configuration of the semiconductor device 200, including one test via or test opening 230 contacting the test pad 240 and providing a high sensitivity with respect to the recess 212 and/or the characteristics of the barrier layer 211.

Figure 2E:
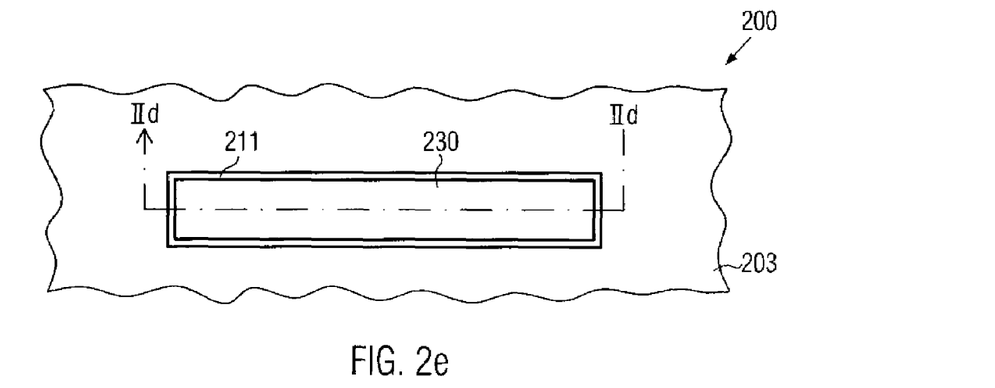

FIG. 2e schematically shows a top view of the structure of FIG. 2d, wherein a substantially rectangular or block-like configuration of the one or more test openings 230 is illustrated.

Figure 2F:
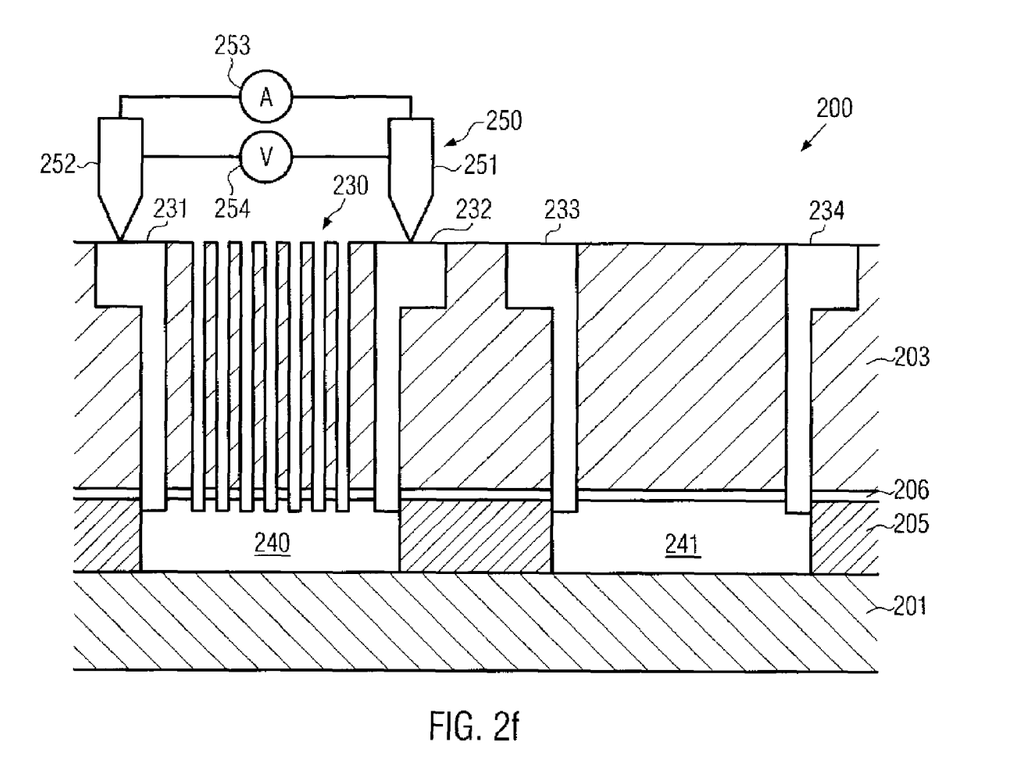
FIG. 2f schematically shows a cross-sectional view of a semiconductor structure including a test structure for estimating the quality of the associated manufacturing sequence, wherein the test structure is connected to an external measurement device in accordance with yet other illustrative embodiments of the present invention.

FIG. 2f schematically shows a cross-sectional view of a further illustrative embodiment of the semiconductor structure 200. In this case, in addition to the test pad 240 having formed thereabove an appropriate arrangement of test vias or openings 230, a reference pad 241 is formed which may, in one illustrative embodiment, have substantially the same design parameters as the test pad 240. For example, the reference pad 241 may have substantially the same dimensions, material composition and contact scheme as the test pad 240, wherein, contrary to the test pad 240, the reference pad 241 may have a reduced number of test vias connected thereto or may have, as shown in FIG. 2f, no test vias at all. Moreover, in FIG. 2f, corresponding contact portions 231 and 232 connecting to the test pad 240 and respective contact portions 233 and 234 connecting to the reference pad 241 are formed in the layer 203. Moreover, an external measurement device 250 is illustrated, which may comprise measurement probes 252 and 251, as well as measurement sections 254 and 253 configured to provide electrical test data, such as current and voltage data, from which the resistivity of the test pad 240 and, if provided, of the reference pad 241 may be determined.

For example, the measurement device 250 may be configured to generate a constant current flowing through the contact portions 231, the test pad 240, the contact portion 232 and the measurement probes 252 and 251, wherein the voltage drop across the measurement probes 252 and 251 may be determined. Similarly, electric measurement data may be obtained from the reference pad 241, which may have a substantially identical configuration so that any influences created by the measurement device 250, i.e., the measurement probes 251, 252 and the contact portions 231, 232, may be substantially compensated for, thereby providing the potential for precisely evaluating the influence of the one or more test vias 230 on the electrical behavior of the test pad 240.

As previously pointed out, corresponding electrical data may be obtained during various manufacturing stages within the specified process flow so that even the influence of a single process or a specified process parameter may be identified and quantitatively estimated on the basis of the electrical test data obtained from the device 250. Depending on the process strategy, the semiconductor structure 200 may be formed on dedicated test substrates or may be provided on product substrates, wherein the accessibility of the contact portions 231, 232, 233 and 234 may depend on the process requirements and the design of the product substrates. For example, in some illustrative embodiments, specific die areas within the substrate 201, which may now represent a product substrate, may have formed therein appropriate semiconductor structures 200 with appropriately dimensioned contact portions 231, 232, 233 and 234 which may allow access during the various manufacturing steps as pointed out above, thereby providing the possibility of efficiently monitoring the etch process for forming actual contact openings, as well as the manufacturing process for forming the barrier layer 211. In other embodiments, the design of the product substrate 201 and the process flow may be selected such that accessibility of the semiconductor structure 200 is provided at a very advanced manufacturing stage only, wherein nevertheless, due to the provision of the reference pad 241, statistically relevant and precise electrical test data may be generated so as to estimate at least one characteristic of the specified process flow.

Figure 2G:
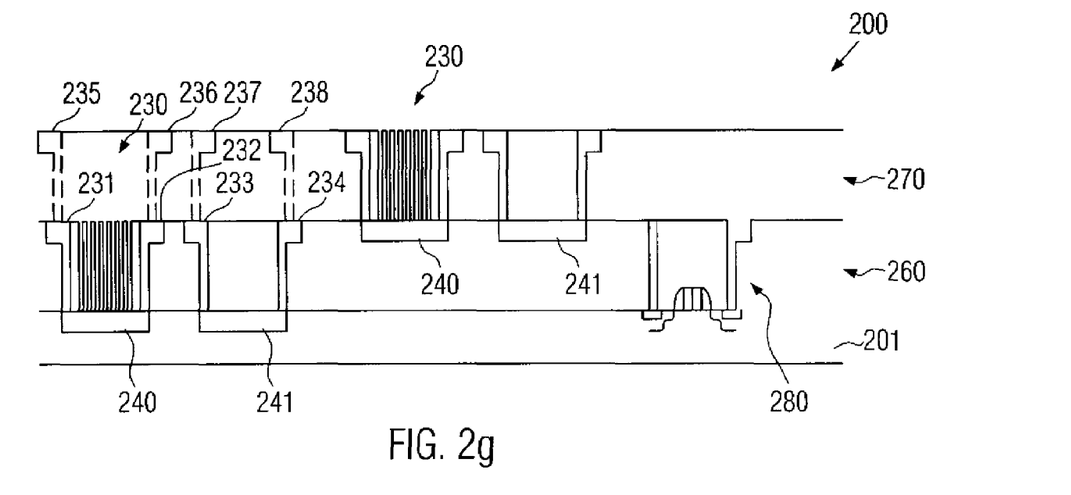
FIG. 2g schematically shows a cross-sectional view of a semiconductor structure including a plurality of stacked test structures that enable the evaluation of corresponding manufacturing sequences for different device layers on the basis of electric measurements according to yet other illustrative embodiments.

FIG. 2g schematically illustrates a cross-sectional view of the semiconductor structure 200 according to a further illustrative embodiment. In this embodiment, the semiconductor structure 200 may comprise a first layer 260, below which conductive regions for a circuit element 280 are formed commonly with respective test pads 240 and reference pads 241. For example, the circuit element 280 may represent a transistor having highly doped metal silicide containing drain and source regions as the conductive regions. In other cases, the layer 260 may represent a first metallization layer of a plurality of metallization layers, which are provided as a layer stack typically encountered in sophisticated integrated circuits. Formed above the first layer 260 is a further metallization layer 270, which may comprise a plurality of metal lines and vias (not shown) in addition to a further test pad 240 and a reference pad 241, wherein the test pads 240 in the layers 260 and 270 have formed thereabove one or more test vias 230. It should be appreciated that the corresponding test structures formed by the test pad 240, the reference pad 241, the one or more test vias 230, and the corresponding contact portions 231, 232, 233 and 234 may be provided at dedicated substrate areas, wherein the plurality of such test structures may be positioned across the substrate to monitor the across-substrate uniformity of the specified process flow. Moreover, during the creation of electrical test data regarding the specified process flow, as is explained above, the test data may be separately determined for the layer 260 after completion of the layer, or, in other embodiments, a respective contact structure, for instance comprising contact portions 235, 236, 237 and 238, may be provided which connects to the corresponding contact portions in the layer 260. Thus, if accessing the contact portions 231, 232, 233, 234 after forming the layer 260 may not be possible or may not be desired, the electrical test data for the layer 260 may be commonly gathered with test data for the layer 270 or even after completion of the formation of an entire metallization layer stack. It should be appreciated that the provision of a first and a second metallization layer is of illustrative nature only and typically a plurality of metallization layers are provided wherein corresponding test structures may be provided for each of the metallization layers or may be provided only for one or more dedicated metallization layers. Furthermore, corresponding electrical test data may be obtained commonly or intermittently, as is described above. Since for each test structure the test pad 240 and the reference pad 241 is provided, a change of the electrical characteristic created by the test vias 230 may nevertheless be efficiently determined, even if the measurement procedure is performed after two or more stacked test structures are completed.

Figure 3:
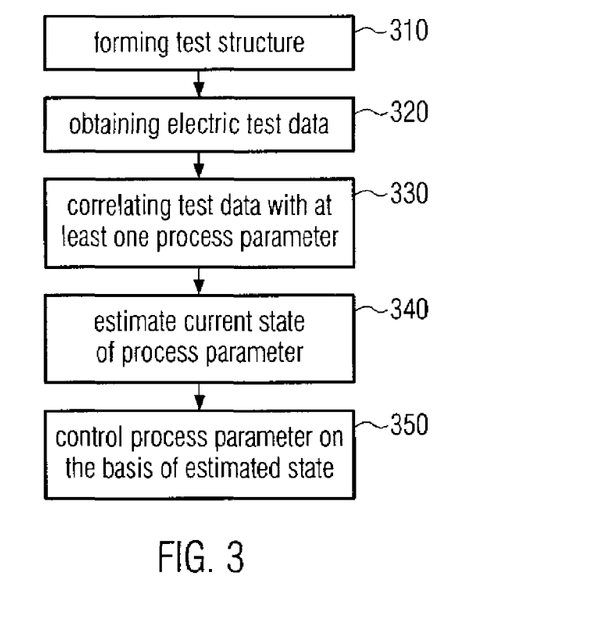
FIG. 3 illustrates a flowchart representing a sequence for monitoring and/or controlling the manufacturing process on the basis of electrical measurements according to further illustrative embodiments of the present invention.

FIG. 3 represents a sequence of activities in order to obtain electrical test data with high statistical significance in a non-destructive manner for estimating one or more process parameters of the specified process flow for forming vias and contacts in a semiconductor device. Box 310 refers to the formation of an appropriate test structure, which may comprise the components as previously described with reference to FIGS. 2a-2g, i.e., which may comprise a test pad of conductive material connected to one or more test vias that are formed in accordance with the specified process flow. The layout and configuration of the individual components is designed such that the resulting electrical test data may reveal desired information on the specified process flow. For example, in some illustrative embodiments, the test vias 230 may have substantially the same design dimensions as the corresponding vias in the actual devices and also the test pad 240 and, if provided, the reference pad 241 may be formed of the same material composition as corresponding conductive regions in the actual devices. Moreover, the contact scheme for contacting the test pad 240 and the reference pad 241 may be designed and formed such that access by an external measurement probe is possible at desired manufacturing stages, as is described above.

Box 320 relates to obtaining electric test data, which may include a measurement process for determining electrical characteristics of the test pad and, if provided, of the reference pad, such as sheet resistance, current and voltage measurement values and the like.

In box 330, the electric test data may be correlated with at least one process parameter of the specified process flow. For example, based on electron microscopy for a few test samples, a relationship between the etch depth, i.e., the recess 212 or 112 (FIG. 1, FIG. 2a) and a specified electrical parameter, such as the sheet resistance, of the test pad may be established. The etch depth in turn may be related to one or more specific parameters, such as etch time for a given etch chemistry and layer thickness. In other examples, the performance of vias in product devices may be used and may be correlated to respective electrical test data to establish a quantitative measure for the "quality" or characteristics of the specified process flow. For instance, time to failure, electromigration measurement data and the like obtained from product devices may be associated with respective electrical test data so as to estimate the specified process flow, for example, in terms of lifetime, reliability and the like.

Box 340 describes the estimation of a current status of one or more process parameters of the specified process flow on the basis of the test data and the correlation established in the previous step. For example, for a given etch recipe, the presently used allowable range of etch times may be determined with respect to the process output, i.e., the effectively obtained recess, by estimating the current status of the process parameter "etch time" in terms of the electric test data. It should be appreciated, however, that other parameters may be estimated, such as deposition time for the barrier layer and the like, as is explained above.

Finally, in box 350, the estimated current state of one or more process parameters obtained in the previous step may be used to control the one or more process parameters in order to bring the specified process flow more on target. Since the electrical test data obtained in step 320 are available with high precision and with high statistical significance due to a possible large sampling number in a short time, a fast response time for controlling the one or more process parameters may be obtained. Thereafter, additional substrates may be processed on the basis of the estimated state.

As a result, the present invention provides an improved technique that enables the evaluation of a specified process flow for forming contacts and vias by measuring at least one electric characteristic of a conductive test pad that is connected to one or more test vias or openings having experienced the specified process flow to be estimated. Hereby, the fact is advantageously exploited that especially the etching into a conductive region may significantly alter its corresponding electrical behavior so that a change in this electrical behavior may be used as a measure for quantifying the manufacturing sequence for forming vias and contacts. By providing an appropriate reference pad, which may have the same dimension and material composition as the test pad, a high degree of independence from the contact configuration for contacting the test pad and the reference pad may be accomplished. Consequently, a high degree of measurement flexibility is obtained, since a corresponding test structure may be formed on dedicated test substrates and/or on dedicated portions of a product substrate, wherein the corresponding contact configuration may be designed so as to allow access by means of an electrical probe after one or more individual processes of the specified process flow and/or after the completion of a whole process sequence. Consequently, highly reliable measurement data may be obtained so as to qualify the specified process flow, for instance in terms of a recess etched into a respective conductive region, wherein a large number of samples may be measured within a short time period by means of a non-destructive technique. Thus, the electrical test data obtained may not only be efficiently used for monitoring the specified process flow but may also be used for controlling one or more process parameters involved in the specified process flow so as to increase process uniformity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a plurality of test vias according to a specified process flow within a dielectric layer so as to provide a connection to a test pad, said specified process flow representing a process flow used to form a via in a dielectric layer to provide an electric connection to a conductive region formed in a semiconductor device;
    obtaining electric test data from said test pad at a point in said process flow where a conductive material does not interconnect said plurality of test vias above a surface of said dielectric layer;
    estimating at least a first characteristic of said specified process flow on the basis of said electric test data; and
    controlling at least one process parameter of said specified process flow on the basis of at least said first estimated characteristic.

2. The method of claim 1, wherein forming said plurality of test vias comprises etching through said dielectric layer and into said test pad according to a specified etch recipe and forming a barrier layer at least on sidewalls of said vias.

3. The method of claim 2, wherein said at least one process parameter comprises a deposition parameter used for forming said baffler layer.

4. The method of claim 1, wherein said electric test data comprise a measurement value related to an electric conductivity of said test pad.

5. The method of claim 1, wherein said via of the semiconductor device and said plurality of test vias are formed in a common manufacturing process including said specified process flow.

6. The method of claim 1, further comprising forming a reference pad commonly with said test pad, wherein a number of test vias connecting to said reference pad is different from a number of said plurality of test vias connecting to said test pad.

7. The method of claim 6, wherein forming said reference pad and test pad comprises using the same design dimensions and the same specified conductive material.

8. The method of claim 1, wherein forming said plurality of test vias comprises etching through said dielectric layer and into said test pad according to a specified etch recipe and said at least one process parameter comprises an etch time of said specified etch recipe.

9. The method of claim 1, further comprising processing one or more substrates according to said process flow using at least said first estimated characteristic.

10. A method, comprising:
    forming a first metallization layer of a semiconductor device according to a first specified process flow, said first metallization layer comprising a first test opening extending at least through a portion of said first metallization layer so as to connect to a first conductive test pad located, together with a first conductive reference pad, below said first metallization layer;
    determining at least one first electric property of said first test pad in relation to said first conductive reference pad;
    estimating at least one first characteristic of said first specified process flow on the basis of said at least one first electric property;
    forming a second metallization layer of said semiconductor device above said first metallization layer according to a second specified process flow, said second metallization layer comprising a second test opening extending at least through a portion of said second metallization layer so as to connect to a second conductive test pad located, together with a second conductive reference pad, below said second metallization layer;

determining at least one second electric property of said second test pad in relation to said second conductive reference pad; and estimating at least one second characteristic of said second specified process flow on the basis of said at least one second electric property.

11. The method of claim 10 further comprising forming said first metallization layer and a first metallization layer of a semiconductor device commonly on a common substrate.

12. The method of claim 2, wherein the at least one characteristic comprises a characteristic of the barrier layer.

13. The method of claim 1, wherein the specified process flow comprises forming openings exposing said test pad and filling said openings with a conductive material, and the method further comprises:

prior to filling said openings with said conductive material, obtaining electric test data from said test pad; and estimating at least a second characteristic of said specified process flow on the basis of said electric test data.

14. The method of claim 13 further comprising controlling at least one process parameter of said specified process flow on the basis of at least said second estimated characteristic.

15. The method of claim 13, wherein forming said plurality of test vias comprises forming a barrier layer at least on sidewalls of said opening, and obtaining said electric test data further comprises obtaining said electric test data from said test pad after forming said barrier layer.

16. The method of claim 13 wherein forming said plurality of test vias comprises forming a barrier layer at least on sidewalls of said opening, and the method further comprises comprising controlling at least one process parameter of said specified process flow for forming said barrier layer on the basis of at least said second estimated characteristic.

17. A method, comprising:

forming a first plurality of test vias according to a specified process flow within a dielectric layer so as to provide a connection to a test pad, said specified process flow representing a process flow used to form a via in a dielectric layer to provide an electric connection to a conductive region formed in a semiconductor device;

forming a second plurality of test vias so as to provide a connection to a reference pad formed commonly with said test pad using the same design dimensions and the same specified conductive material, wherein a number of test vias in said second plurality of test vias connecting to said reference pad is different from a number of said first plurality of test vias connecting to said test pad;

obtaining electric test data from said test pad and the reference pad; and estimating at least one characteristic of said specified process flow on the basis of said electric test data.

18. The method of claim 17, further comprising controlling at least one process parameter of said specified process flow on the basis of said at least one estimated characteristic.

19. The method of claim 17, further comprising processing one or more substrates according to said process flow using said at least one estimated characteristic.

\* \* \* \* \*

UNITED STATES PATENT AND TRADEMARK OFFICE
CERTIFICATE OF CORRECTION

PATENT NO. : 7,491,555 B2
APPLICATION NO. : 11/419782
DATED : February 17, 2009
INVENTOR(S) : Matthias Lehr, Kai Frohberg and Holger Schuehrer

Page 1 of 1

It is certified that error appears in the above-identified patent and that said Letters Patent is hereby corrected as shown below:

Col. 16, line 24 (claim 3, line 3), delete "baffler" and insert therefore -- barrier --

Signed and Sealed this

Thirty-first Day of March, 2009

JOHN DOLL
*Acting Director of the United States Patent and Trademark Office*